(12) United States Patent
Clendenning et al.

(10) Patent No.: US 11,227,798 B2
(45) Date of Patent: Jan. 18, 2022

(54) METAL ALUMINUM GALLIUM INDIUM CARBIDE THIN FILMS AS LINERS AND BARRIERS FOR INTERCONNECTS

(71) Applicant: INTEL CORPORATION, Santa Clara, CA (US)

(72) Inventors: Scott B. Clendenning, Portland, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,135

(22) PCT Filed: Sep. 29, 2016

(86) PCT No.: PCT/US2016/054302
§ 371 (c)(1),
(2) Date: Feb. 15, 2019

(87) PCT Pub. No.: WO2018/063208
PCT Pub. Date: Apr. 5, 2018

(65) Prior Publication Data
US 2019/0189505 A1    Jun. 20, 2019

(51) Int. Cl.
*H01L 21/768*    (2006.01)
*H01L 23/532*    (2006.01)
*H01L 21/285*    (2006.01)

(52) U.S. Cl.
CPC .. *H01L 21/76843* (2013.01); *H01L 21/28556* (2013.01); *H01L 21/76831* (2013.01);
(Continued)

(58) Field of Classification Search
None
See application file for complete search history.

(56) References Cited

U.S. PATENT DOCUMENTS 6,307,265 B1    10/2001  Anand et al.
2007/0075427 A1*  4/2007  Lavoie .............. H01L 21/28562
                                                257/750
(Continued)

FOREIGN PATENT DOCUMENTS

WO    WO2016/105423    *  6/2016

OTHER PUBLICATIONS

PCT/US2016/054302, International Search Report and Written Opinion, dated Jun. 26, 2017, 12 pages.
(Continued)

*Primary Examiner* — Walter H Swanson
(74) *Attorney, Agent, or Firm* — Schwabe, Williamson & Wyatt, P.C.

(57) ABSTRACT

Disclosed are electronic device assemblies, computing devices, and related methods. An electronic device assembly or a computing device includes an interlayer dielectric region between a first region and a second region, a conductive interlayer structure formed through the interlayer dielectric region, and a barrier region formed around the conductive interlayer structure. The conductive interlayer structure includes a composition of $M_l$-$Al_m$—$X^1_n$—$X^2_p$—$C_q$—$O_r$, wherein M comprises a metal selected from one or more of titanium, zirconium, hafnium, tantalum, niobium and vanadium; C comprises carbon; O comprises oxygen; $X^1$ comprises gallium; $X^2$ comprises indium; and l, m, n, p, q and r represent an atomic percent of an element in the barrier region that can be 0 percent, but n and p cannot both be 0 percent. A method includes forming the barrier region within a passage through the interlayer dielectric region.

24 Claims, 7 Drawing Sheets

(52) U.S. Cl.
CPC .. *H01L 21/76832* (2013.01); *H01L 21/76846* (2013.01); *H01L 23/53209* (2013.01); *H01L 23/53223* (2013.01); *H01L 23/53238* (2013.01); *H01L 23/53252* (2013.01); *H01L 23/53276* (2013.01); *H01L 23/53295* (2013.01)

(56) References Cited

U.S. PATENT DOCUMENTS

| | | | |
|---|---|---|---|
| 2009/0026622 A1 | 1/2009 | Amano et al. | |
| 2010/0330800 A1* | 12/2010 | Ivanov | C23C 14/024 438/622 |
| 2011/0127673 A1* | 6/2011 | Anderson | H01L 21/76883 257/751 |
| 2012/0164434 A1 | 6/2012 | Ramadas et al. | |
| 2014/0060648 A1 | 3/2014 | Prasad et al. | |
| 2014/0231998 A1 | 8/2014 | Kuo et al. | |
| 2014/0291819 A1* | 10/2014 | Barth | H01L 23/53276 257/659 |

OTHER PUBLICATIONS

International Preliminary Report on Patentability for PCT Application No. PCT-US2016/054302 dated Apr. 11, 2019, 8 pgs.

* cited by examiner

METAL ALUMINUM GALLIUM INDIUM CARBIDE THIN FILMS AS LINERS AND BARRIERS FOR INTERCONNECTS

RELATED APPLICATION(S)

This application is a national stage filing under 35 U.S.C. § 371 of International Patent Application No. PCT/US2016/054302, filed Sep. 29, 2016, which is incorporated by reference herein in its entirety.

BACKGROUND

Barrier materials are employed in integrated circuits to prevent diffusion of one material into another material (e.g., during manufacturing or operation of the integrated circuits). For these barrier materials, it is desirable that the barrier material be inert with respect to the surrounding materials, and that the barrier materials adhere to the surrounding materials.

For barrier materials used as a barrier for a conductive structure, it may also be desirable that the barrier materials be conductive to avoid unwanted resistance. As critical dimensions of integrated circuits decrease, it is increasing difficult to maintain low resistance of barrier materials without occupying a large amount of valuable spatial volume.

DETAILED DESCRIPTION

Figure 1:
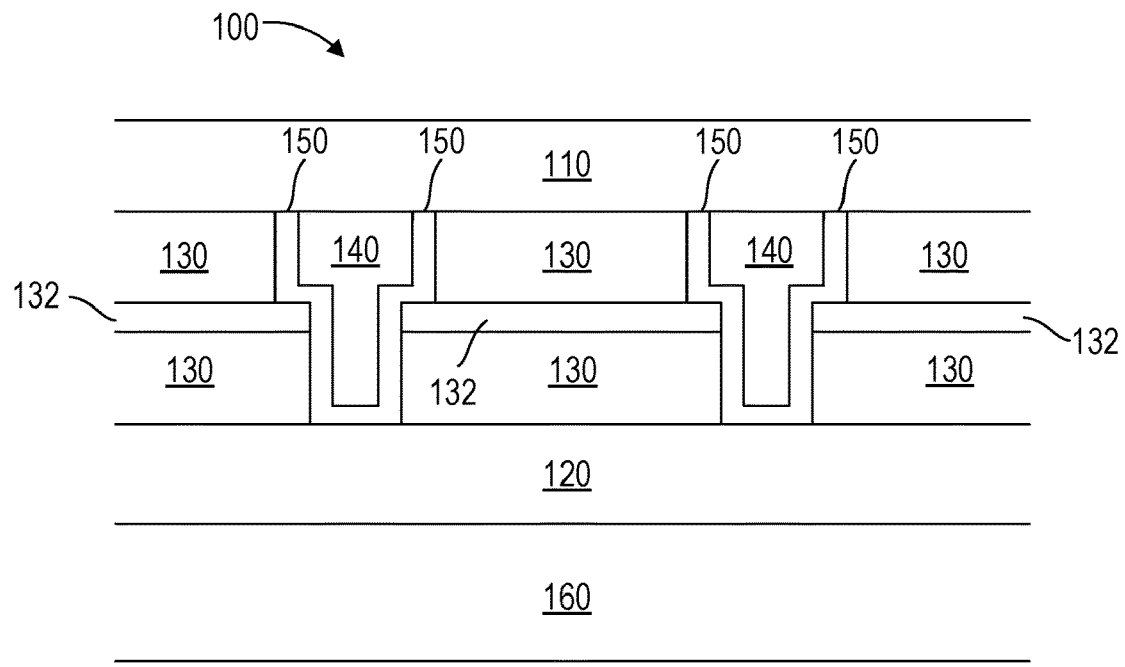
FIG. 1 is a simplified cross-sectional view of an electronic device assembly, according to some embodiments.

Disclosed herein are electronic device assemblies and computing devices including a conductive interlayer structure with an improved barrier region between the conductive interlayer structure and an interlayer dielectric region, and related methods of forming such. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. It will be apparent to one skilled in the art, however, that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order in which the operations are presented in the description, however, should not be construed to imply that these operations are necessarily order dependent. In particular, these operations need not be performed in the order of presentation. Rather, in some embodiments, the order may be modified.

The terms "over," "under," "between," and "on," as used herein, refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. Furthermore, As used herein, the term "conductive" refers to electrically conductive.

Implementations of the disclosure may be formed or carried out on a substrate, such as a semiconductor substrate. In one implementation, the semiconductor substrate may be a crystalline substrate formed using a bulk silicon or a silicon-on-insulator (SOI) substructure (e.g., silicon-on-glass (SOG), silicon-on-sapphire (SOS), etc.). In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although implementations described herein may refer to planar transistors, it should be noted that the implementations may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may include a "U-shaped" structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may include one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. In further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

The ILD layers may also include conductive interlayer structures formed therethrough to provide conductive interfaces between regions separated by the ILD layers. The conductive interfaces may be protected by barrier/liner materials. As critical dimensions of these conductive interlayer structures descend below 20 nanometers (nm), the barrier/liner materials needed for adhesion and or diffusion barrier properties occupies an increasingly large percentage of the available conducting volume. As a result, a low resistivity, ultrathin material is desirable.

Conventional barrier materials often include relatively high resistivity tantalum nitride based films. Since the barrier material may also cover a via or contact hole bottom, high resistivity materials, such as tantalum nitride, cause unacceptably high via and contact resistances, which tend to dominate overall front end metric (FEM) delay (e.g., a measurement of the impact of transistor structure on signal delay). A lower resistance Ruthenium (Ru) barrier material is sometimes used. Due to poor barrier and adhesion properties of Ru to interlayer dielectric materials, however, Ru is sometimes combined with an additional barrier/adhesion layer, thus occupying an increased cross-sectional area as compared to the Ru layer alone.

Disclosed herein are electronic device assemblies and computing devices including a new class of ultrathin, low resistivity, conformal atomic layer deposited barrier/liner regions for back end of line (BEOL) interconnects, and methods of forming such.

In some embodiments, disclosed is an electronic device assembly including a first region, a second region, an interlayer dielectric region, a conductive interlayer structure, and a barrier region formed around the conductive interlayer structure. The first region and the second region have circuitry formed therein or thereon. The interlayer dielectric region is between the first region and the second region. The conductive interlayer structure is formed through the interlayer dielectric region and connects the first region to the second region. The barrier region includes a composition of General Formula $M_l\text{-}Al_m\text{---}X^1_n\text{---}X^2_p\text{---}C_q\text{---}O_r$, where M includes a metal selected from one or more of titanium, zirconium, hafnium, tantalum, niobium and vanadium, present with atomic percent "l" in the film; C includes carbon; O includes oxygen; $X^1$ includes gallium; $X^2$ includes indium; and m, n, p, q and r represent an atomic percent of an element in the barrier region that can be 0 percent, but n and p cannot both be 0 percent. l is 0-60 atomic percent, m is 0-35 atomic percent, n is 0-70 atomic percent, p is 0-70 atomic percent, q is 0-50 atomic percent, and r is 0-5 atomic percent.

In some embodiments, disclosed is a method of forming an electronic device assembly. The method includes heating a substrate including an interlayer dielectric region formed therein or thereon, the interlayer dielectric region including a passage formed therethrough, and exposing a surface of the passage to a first precursor, a metal cation of the first precursor selected from the group consisting of titanium, zirconium, hafnium, tantalum, niobium and vanadium. The method also includes removing any unreacted portions of the first precursor and reaction by-products, exposing the surface of the passage to a second precursor molecule comprising one of an alkylgallium precursor or an alkylindium precursor, and removing any unreacted portion of the second precursor molecule and reaction by-products. The method further includes repeating the exposing and removing acts until a barrier region having a desired thickness is formed, and forming a conductive interlayer structure within the passage.

In some embodiments, disclosed is a computing device including a processor mounted on a substrate, a memory unit capable of storing data, and a graphics processing unit. At least one of the processor, the memory unit, and the graphics processing unit includes an interlayer dielectric region between a first region and a second region, a conductive interlayer structure formed through the interlayer dielectric region, and a barrier region between the conductive interlayer structure and the interlayer dielectric region. The barrier region includes a composition of $M_l$-$Al_m$—$X^1_n$—$X^2_p$—$C_q$—$O_r$. M includes a metal selected from one or more of titanium, zirconium, hafnium, tantalum, niobium and vanadium. C includes carbon. O includes oxygen. $X^1$ includes gallium. $X^2$ includes indium. The variables l, m, n, p, q and r represent an atomic percent of an element in the barrier region that can be 0 percent, but n and p cannot both be 0 percent FIG. 1 is a simplified cross-sectional view of an electronic device assembly 100. The electronic device assembly 100 includes a first region 110, a second region 120, and an interlayer dielectric region 130 between the first region 110 and the second region 120. In some embodiments, the interlayer dielectric region 130 may include an etch stop region 132. The electronic device assembly 100 also includes at least one conductive interlayer structure 140 formed through the interlayer dielectric region 130. The conductive interlayer structure 140 electrically connects the first region to the second region. For example, the conductive interlayer structure 140 electrically connects circuitry formed on or in the first region 110 to circuitry formed on or in the second region 120.

The conductive interlayer structure 140 illustrated in FIG. 1 is shown as a dual damascene structure (e.g., extending through a trench and via). In some embodiments, however, the conductive interlayer structure 140 may instead be a single damascene structure (e.g., extending through only one of a trench and a via).

The electronic device assembly 100 also includes at least one barrier region 150 formed around the conductive interlayer structure 140. In some embodiments, the barrier region 150 has a thickness of about 0.5 to 3 nanometers (nm). The barrier region 150 may be formed using a thermal atomic layer deposition (ALD) of BEOL barrier/liner films of, for example, metal aluminum gallium carbide (M(Al)(Ga)C), metal gallium carbide, (M(Ga)C), metal aluminum indium carbide, M(Al)(In)C, or metal indium carbide (M(In)C). By way of non-limiting example, the metal M may include one or more of titanium (Ti), zirconium (Zr), hafnium (Hf), tantalum (Ta), niobium (Nb), and vanadium (V). These films are deposited using an ALD process based on a metal halide: $MX_n$, where X=F, Cl, Br, or I, and n=4 or 5, and one or two additional group 13 organometallic coreactants.

The barrier region 150 may be disposed in a conformal manner about 0.5 to 3 nm thick (e.g., onto a surface of a passage through the interlayer dielectric region 130, onto a surface of the conductive interlayer structure 140). By way of non-limiting example, the barrier region 150 may be disposed on the surface of a patterned interlayer dielectric interconnect structure prior to metal fill with a low resistance metal (such as copper (Cu), cobalt (Co), ruthenium (Ru), nickel (Ni), tungsten (W), alpha tantalum (Ta), beta Ta, etc.) using a standard technique, such as physical vapor deposition, evaporation, atomic layer deposition, chemical vapor deposition, electroless metal deposition or electroplating.

More generally, the barrier region 150 includes a composition of General Formula I:

$$M-Al_m—X^1_n—X^2_p—C_q—O_r, \qquad (I)$$

where C is carbon, O is oxygen, $X^1$ is gallium, $X^2$ is indium, and m, n, p, q and r represent an atomic percent of an element in the barrier region that can be 0 percent, but n and p cannot both be 0 percent. By way of non-limiting example, the barrier region 150 may include ALD TaAlGaC, TaGaC, NbAlGaC, NbGaC, TiAlGaC, ZrGaC, HfAlGaC, other materials, or combinations thereof.

In some embodiments, m is 0 to 35 atomic percent, n is 0 to 70 atomic percent, p is 0 to 70 atomic percent, q is 0.1 to 60 atomic percent, and r is 0 to 5 atomic percent. In some embodiments, M is present in an amount of 10 to 60 atomic percent. In some embodiments, n is 0.1 to 70 atomic percent and p is 0 atomic percent. In some embodiments, p is 0.1 to 70 atomic percent and n is 0 atomic percent. In some embodiments, m is 5 to 35 atomic percent and only one of n and p is 0 atomic percent.

In some embodiments, the barrier region 150 is doped with manganese Mn. The Mn doping may cause discontinuities in the material of the barrier region 150 to be tolerable.

Figure 2:
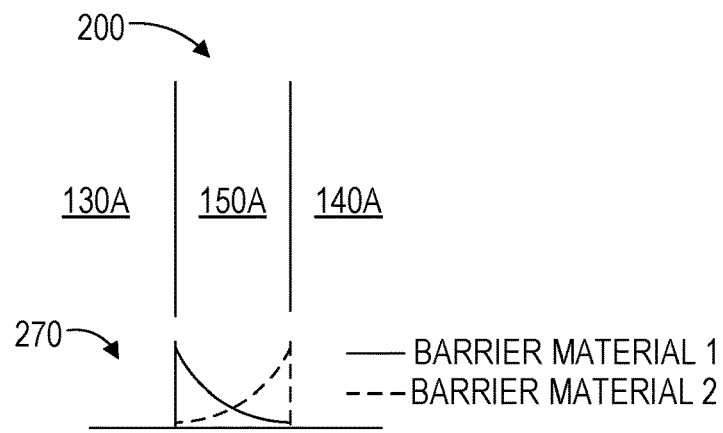
FIG. 2 is a simplified cross-sectional view of an example interface between an interlayer dielectric and a conductive interlayer structure, according to some embodiments.
Figure 3:
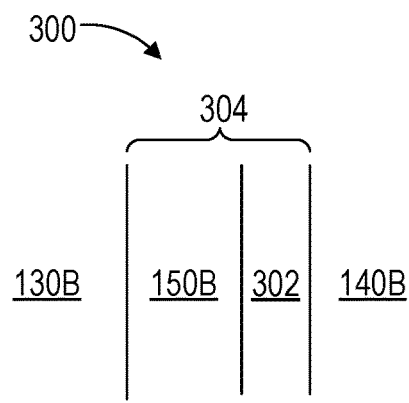
FIG. 3 is a simplified cross-sectional view of an example interface between an interlayer dielectric and a conductive interlayer structure, according to some embodiments.

In some embodiments, the barrier region 150 may include a plurality of different barrier materials according to General Formula I. FIG. 2 below illustrates an example of such a material interface 200. In some embodiments, the barrier region may be co-deposited with a second metal to form a composite liner material with improved wetting of a current carrying metal (e.g., Cu, Co, etc.). FIG. 3 below illustrates an example of such a material interface 300.

In some embodiments, the conductive interlayer structure 140 has a critical dimension of less than about 20 nanometers (nm). In some embodiments, the conductive interlayer structure 140 includes copper, (Cu), cobalt (Co), ruthenium (Ru), and nickel (Ni).

The first region 110 and the second region 120 each include circuitry formed therein or thereon. By way of non-limiting example, the first region 110 and the second region 120 may include circuitry for a processor, a memory unit, a graphics processing unit, other devices, or combinations thereof. Accordingly, the conductive interlayer structure 140 is configured to electrically connect the circuitry of the first region 110 to the circuitry of the second region 120.

In some embodiments, the interlayer dielectric 130 includes low-k dielectric materials. In some embodiments, the interlayer dielectric includes silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, organosilicate glass, other materials, or combinations thereof.

The electronic device assembly 100 may be formed on or in a substrate 160. The substrate 160 may include a semiconductor substrate, as discussed above.

FIG. 2 is a simplified cross-sectional view of an example interface 200 between an interlayer dielectric 130A and a conductive interlayer structure 140A. The interface 200 includes a barrier region 150A including a graded composition of a plurality of compositions of General Formula I. For example, the barrier region 150A includes a barrier material 1 and a barrier material 2, each of which is a composition according to General Formula I.

As illustrate in a plot 270 shown below the barrier region 150A in FIG. 2, Barrier material 1 has a higher concentration than barrier material 2 at an interface between the interlayer dielectric 130A and the barrier region 150A. Also, barrier material 2 has a higher concentration than barrier material 1 at an interface between the conductive interlayer structure 140A and the barrier region 150A. Accordingly, barrier material 1 may be selected to have good adhesion characteristics for a material of the interlayer dielectric 130A. Also, barrier material 2 may be selected to have good adhesion characteristics for a material of the conductive interlayer dielectric 140A. In this way, good adhesion of the barrier region 150A may be ensured for both the interlayer dielectric 130A and the conductive interlayer structure 140A.

FIG. 3 is a simplified cross-sectional view of an example interface 300 between an interlayer dielectric 130B and a conductive interlayer structure 140B. The interface 300 includes a barrier region 150B co-deposited with a second metal 302 to form a composite liner material 304 with improved wetting of the conductive interlayer structure 140B (e.g., Cu, Co, etc.). The second metal 302 may also improve adhesion to the interlayer dielectric region 130B. In some embodiments, the second metal 302 includes Ru. In some embodiments, the second metal 302 includes Mn. Improved wetting benefits both gapfill and electromigration resistance of a structure including the conductive interlayer structure 140B, and the barrier region 150B co-deposited with the second metal 302. The composite liner 304 may be more catalytic for subsequent electroless nucleation of metals (e.g., Cu and Co) and exhibit improved oxidation resistance.

Figure 4A:
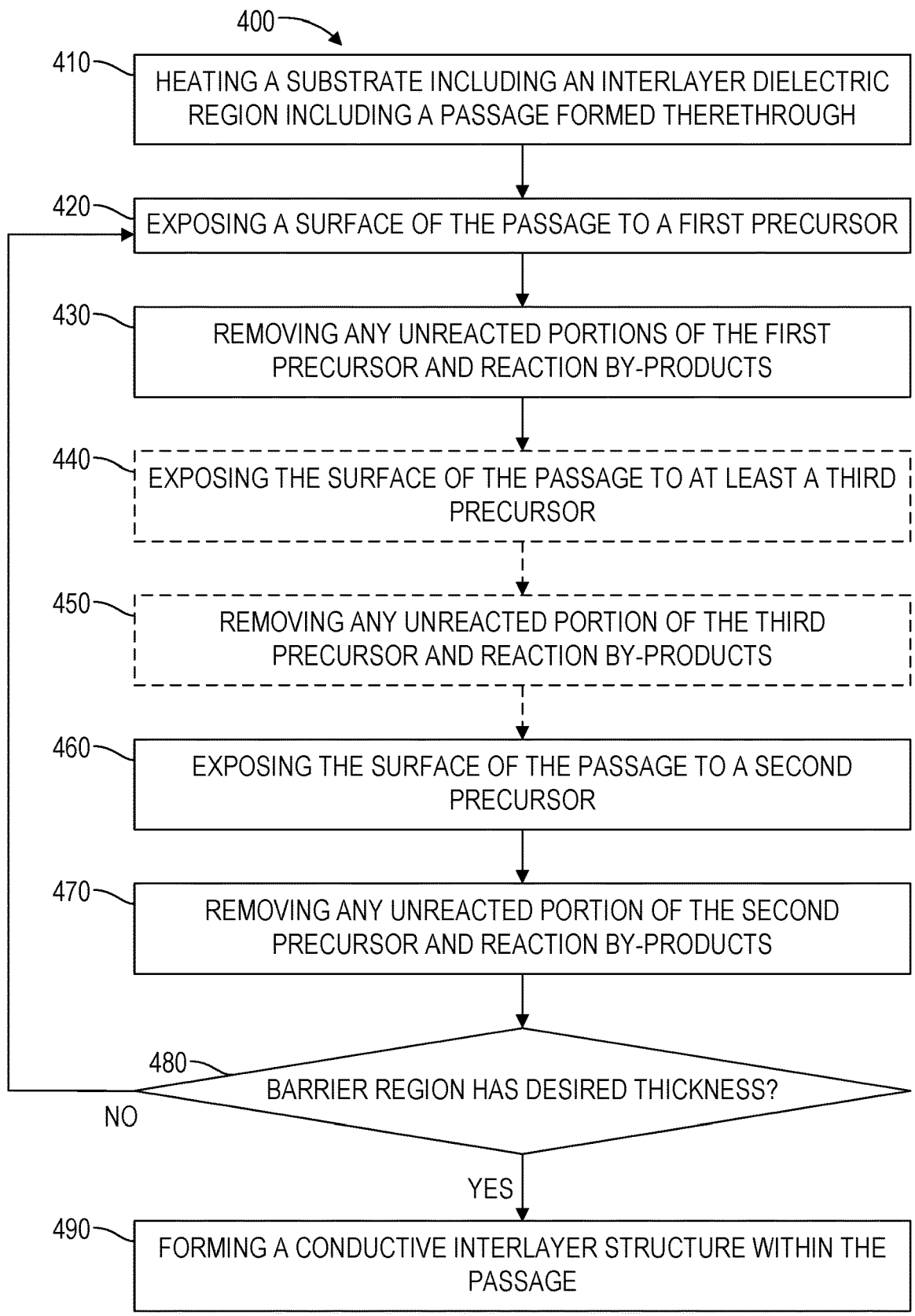
FIG. 4A is a simplified flowchart illustrating a method of forming an electronic device assembly, according to some embodiments.

FIG. 4A is a simplified flowchart illustrating a method 400 of forming an electronic device assembly. FIGS. 4B-4G illustrate acts of the method 400 of FIG. 4A performed on an electronic device assembly 100C. Referring to FIGS. 4A-4G together, the method 400 includes heating 410 a substrate 160 including an interlayer dielectric region 130 formed therein or thereon, the interlayer dielectric region 130 including at least one passage 402 formed therethrough. In some embodiments, the at least one passage 402 may include a trench, a via, or a combination of a trench and a via. IN some embodiments, the passage 402 may include some other type of passage. The passages 402 illustrated in FIGS. 4B-4E include both a trench and a via, and thus the illustrations 4B-4G for the method 400 are for a dual damascene process. The method 400 is not so limiting, however. Rather, the method 400 extends to single damascene processes. In other words, in some embodiments, the term "passage" may refer to only one of a trench and a via.

Figure 4B:
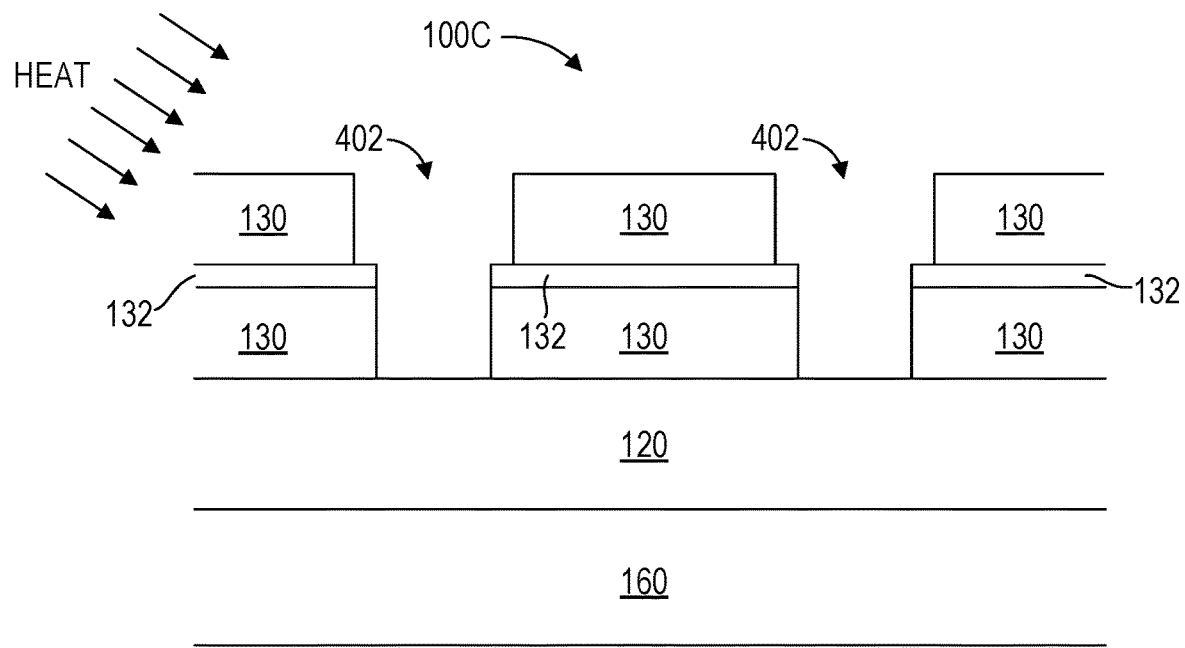
FIGS. 4B-4G illustrate acts of the method of FIG. 4A performed on an electronic device assembly, according to some embodiments.

Heating 410 the substrate 160 is illustrated by FIG. 4B. FIG. 4B shows the interlayer dielectric region 130 including the at least one passage 402 disposed on a first region 120. In some embodiments, heating 410 the substrate 160 includes heating the at least one passage to between 100° C. and 500° C.

Figure 4C:
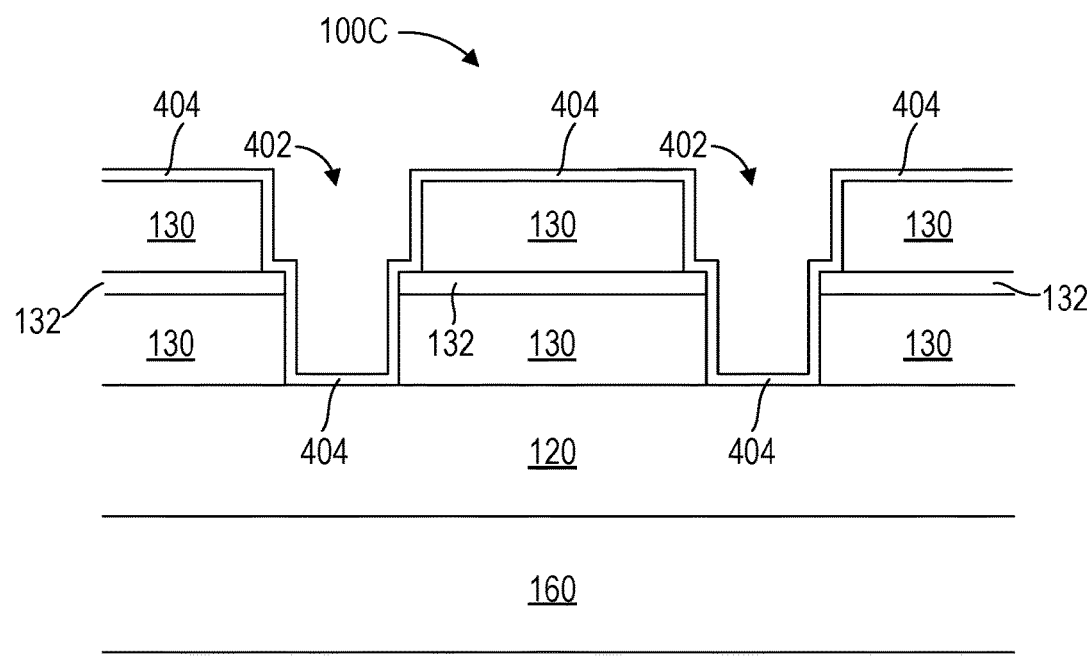
Figure 4D:
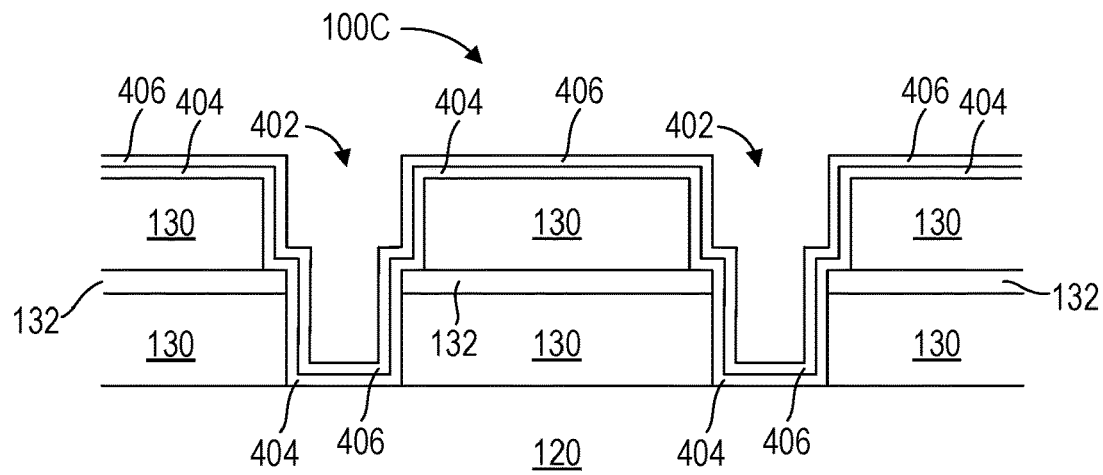

The method 400 also includes exposing 420 a surface of the passage 402 to a first precursor 404 ($MX_n$). A metal cation of the first precursor 404 may be selected from titanium, zirconium, hafnium, tantalum, niobium and vanadium, where n is 4 or 5, and X is fluorine, chlorine bromine, or iodine. FIG. 4C illustrates the first precursor 404 disposed on the electronic device assembly 100C of FIG. 4B. The method 400 further includes removing 430 any unreacted portions of the first precursor and reaction by-products.

The substrate is then exposed to the vapor of one, two, or three additional group 13 organometallic chemical precursors designated as "coreactants," each of which is followed by a purge operation to remove unreacted coreactant and by-products.

Figure 4E:
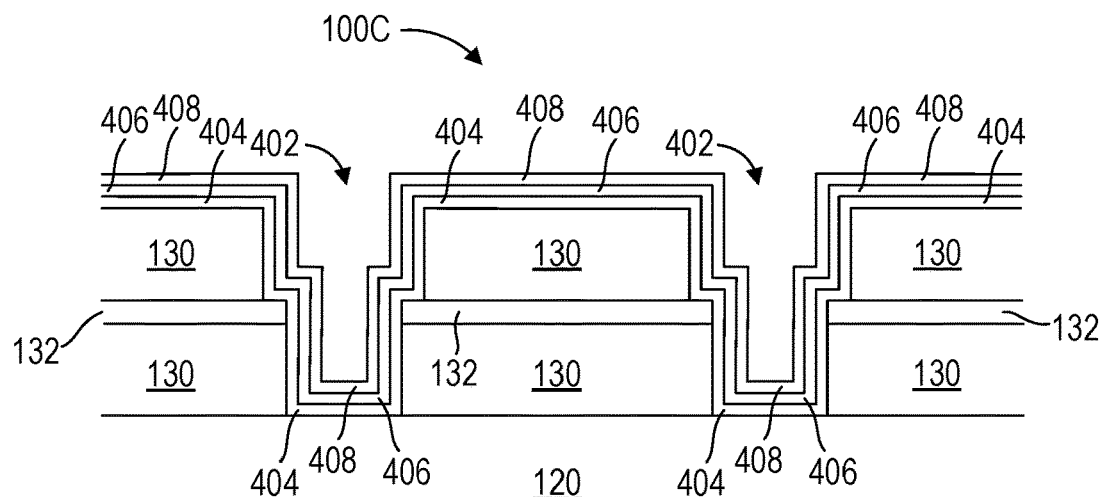

In some embodiments, the method 400 may optionally include exposing 440 the surface of the passage 402 to at least a third precursor 406. By way of non-limiting example, exposing 440 the surface of the passage 402 to at least a third precursor 406 may include exposing 440 the surface of the passage 402 to an alkylaluminum precursor. By way of non-limiting example, the alkylaluminum precursor may include a trialkylaluminum molecule, $AlR_3$, where R=Me, Et, $^nPr$, $^iPr$, $^nBu$, $^{iso}Bu$ or $^{sec}Bu$. FIG. 4E illustrates the at least a third precursor 406 disposed on the electronic device assembly 100C. In such embodiments, the method 400 also includes removing 450 any unreacted portion of the at least the third precursor 406 and reaction by-products.

The method 400 also includes exposing 460 the surface of the passage 402 to a second precursor 408 comprising an alkylgallium or alkylindium precursor. By way of non-limiting example, the second precursor 408 may include an organogallium precursor such as a trialkylgallium molecule, $GaR_3$, where R=Me, Et, $^nPr$, $^iPr$, $^nBu$, $^{iso}Bu$ or $^{sec}Bu$. Also by way of non-limiting example, the second precursor 408 may include a trialkylindim molecule, $InR_3$, where R=Me, Et, $^nPr$, $^iPr$, $^nBu$, $^{iso}Bu$ or $^{sec}Bu$. FIG. 4E illustrates the second precursor 408 disposed on the electronic device assembly 100C. The method 400 further includes removing 470 any unreacted portion of the second precursor 408 and reaction by-products.

In some embodiments, exposing 440 the surface of the passage 402 to at least a third precursor 406 includes exposing the surface of the passage 402 to the other one of the alkylgallium or alkylindium precursor other than that used in exposing 460 the surface of the passage 402 to the second precursor 408. In some embodiments, exposing 440 the surface of the passage 402 to at least a third precursor 406 includes exposing the surface of the passage 402 to the other one of the alkylgallium or alkylindium precursor other than that used in exposing 460 the surface of the passage 402 to the second precursor 408 in addition to exposing the surface of the passage 402 to the alkylaluminum precursor.

The method 400 includes decision 480, which includes determining whether a barrier region 450 formed by operations 420-470 has a desired thickness. If not, the method includes returning to operation 420. Accordingly, the method 400 includes repeating operations 420-470 until a desired thickness of the barrier region 450 is formed.

Figure 4F:
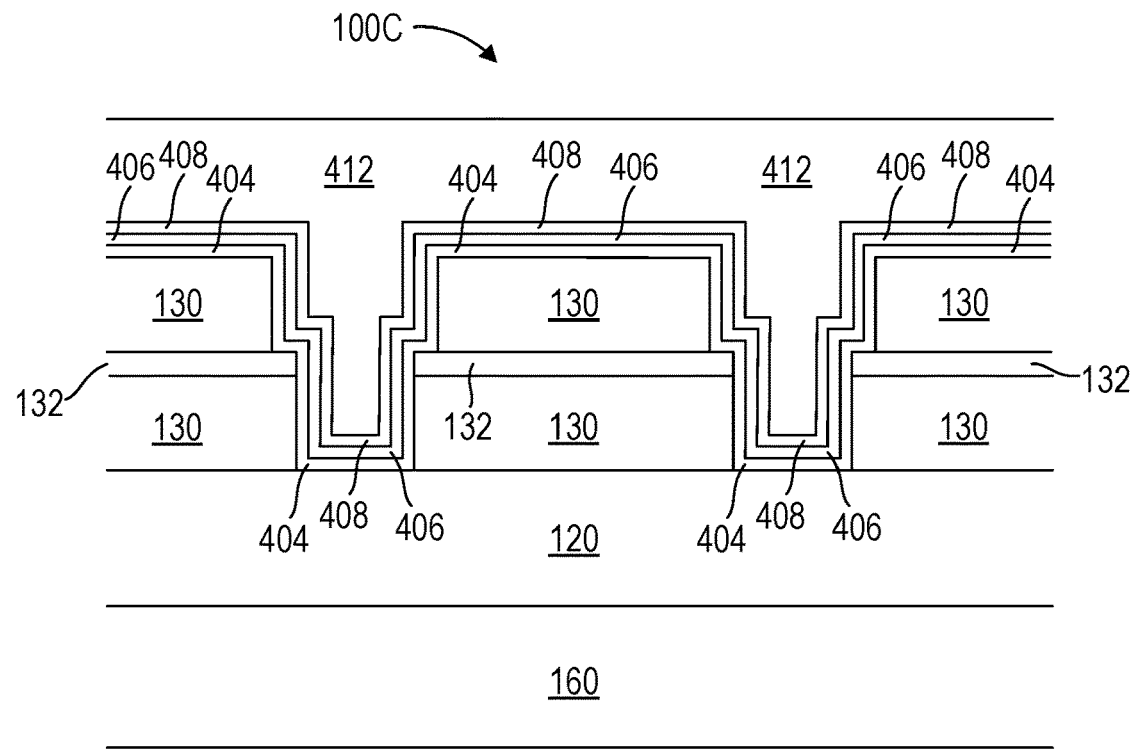
Figure 4G:
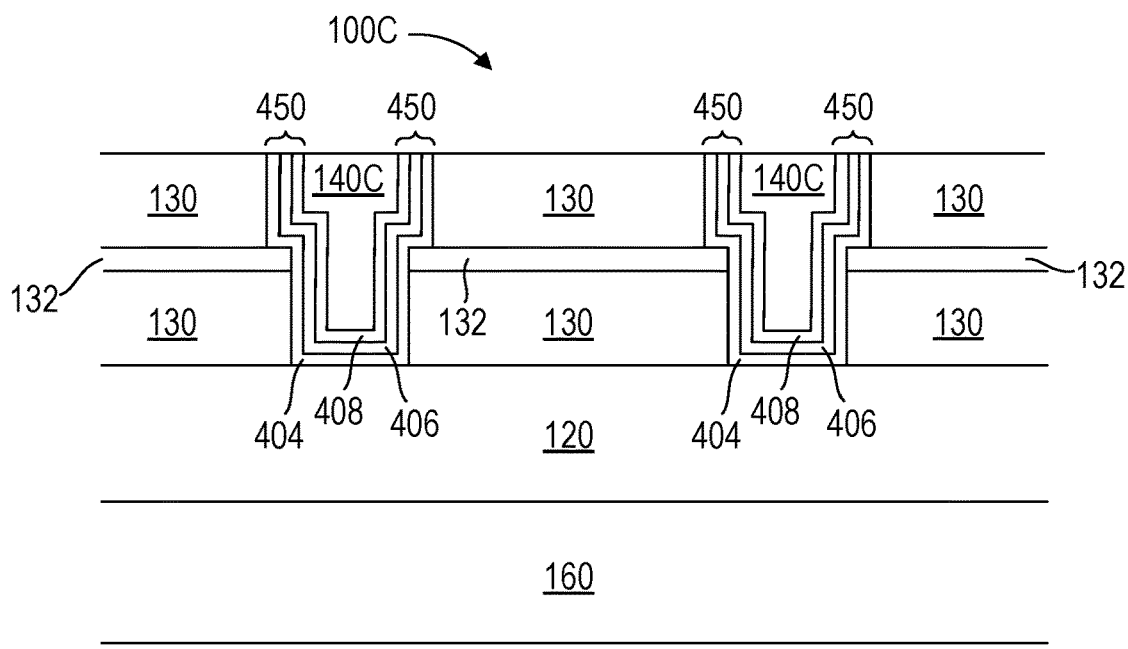

Once the barrier region 450 is of a desired thickness, the method 400 includes forming 490 a conductive interlayer structure 140C within the passage 402. FIGS. 4F and 4G illustrate the conductive interlayer structure 140C being formed within the passage 402. For example, FIG. 4F illustrates a conductive material 412 disposed on the electronic device assembly 100C. In some embodiments, the conductive material 412 includes one or more of Cu, Co, Ru, Ni, W, alpha Ta, beta Ta, or combinations thereof. By way of non-limiting example, the conductive material 412 may be disposed in on the electronic device assembly 100C using a physical vapor deposition, evaporation, atomic layer deposition, chemical vapor deposition, electroless metal deposition, electroplating, other methods, or combinations thereof. FIG. 4G illustrates the electronic device assembly 100C of FIG. 4F after a portion of the conductive material 412 has been removed. By way of non-limiting example, the portion of the conductive material 412 may be removed by a chemical mechanical polishing (CMP) process. As shown in FIG. 4G, remaining conductive material 412 within the passage 402 (FIGS. 4B-4E) are interlayer conductive structures 140C.

In embodiments where only one additional group 13 organometallic chemical precursor is used (i.e., acts 440 and 450 are not included), the barrier region 450 may include a metal gallium carbide (M(Ga)C) or a metal indium carbide (M(In)C). In embodiments where two additional group 13 organometallic chemical precursors are used (i.e., acts 440 and 450 are included for just one third precursor 406), the barrier region 450 may include a metal aluminum gallium carbide (M(Al)(Ga)C), a metal aluminum indium carbide (M(Al)(In)C), or a metal gallium indium carbide. In embodiments where three additional group 13 organometallic chemical precursors are used (i.e., acts 440 and 450 are included for two third precursors 406), the barrier region 450 may include a metal aluminum gallium indium carbide. Each of these thermal ALD metal films for barrier regions 450 are generally of lower resistance than related metal aluminum carbide films. For example, such barrier regions 450 have less resistivity than traditional Ta(Al)C films.

Table 1 illustrates eight cases of different combinations of the use of the metal halide with one, two, and three additional group 13 organometallic chemical precursors:

TABLE 1

Eight Cases of Different Combinations of $MX_n$ with Group 13 Precursors

| Case | Metal Halide | Third Precursor | Second Precursor | Additional Third Precursor | Barrier Region Composition |
|---|---|---|---|---|---|
| 1 | $MX_n$ | None | GaR3 | None | MGaC |
| 2 | $MX_n$ | None | InR3 | None | MinC |
| 3 | $MX_n$ | InR3 | GaR3 | None | MgaInC |
| 4 | $MX_n$ | GaR3 | InR3 | None | MgaInC |
| 5 | $MX_n$ | GaR3 | AlR3 | None | MalGaC |
| 6 | $MX_n$ | InR3 | AlR3 | None | MalInC |
| 7 | $MX_n$ | GaR3 | AlR3 | InR3 | MalGaInC |
| 8 | $MX_n$ | InR3 | AlR3 | GaR3 | MAlGaInC |

Each of cases 1-8 can be the unique ALD pulses sequence or can represent a subcycle in a larger super cycle process that allows for the incorporation of two or more different metals M or for finer tuning of the film composition and physical properties such as resistivity, roughness or work function. For example, one could run supercycles consisting of 2 subcycles of Case 1 where MXn=TaCl5 and GaR3=GaEt3 followed by 3 subcycles of Case 6 where MXn=TiCl4 and AlR3=AlMe3 and InR3=InEt3 to deposit a TaTiAlGaIn film. All ALD processes are run with a substrate temperature between 300 C and 450 C.

It is believed that the lower resistance of barrier regions 450 disclosed herein can be understood in terms of the incomplete removal of metal halogen bonds in the growing film using a trialkylaluminum coreactant. These unreacted metal halogen bonds readily hydrolyze upon air exposure, leading to an increased resistivity. Used on their own or in addition to a trialkylaluminum coreactant, it is believed that trialkylgallium or trialkylindium coreactants are able to more effectively remove halogen atoms from the film leading to a more air-stable, lower resistance film.

Figure 5:
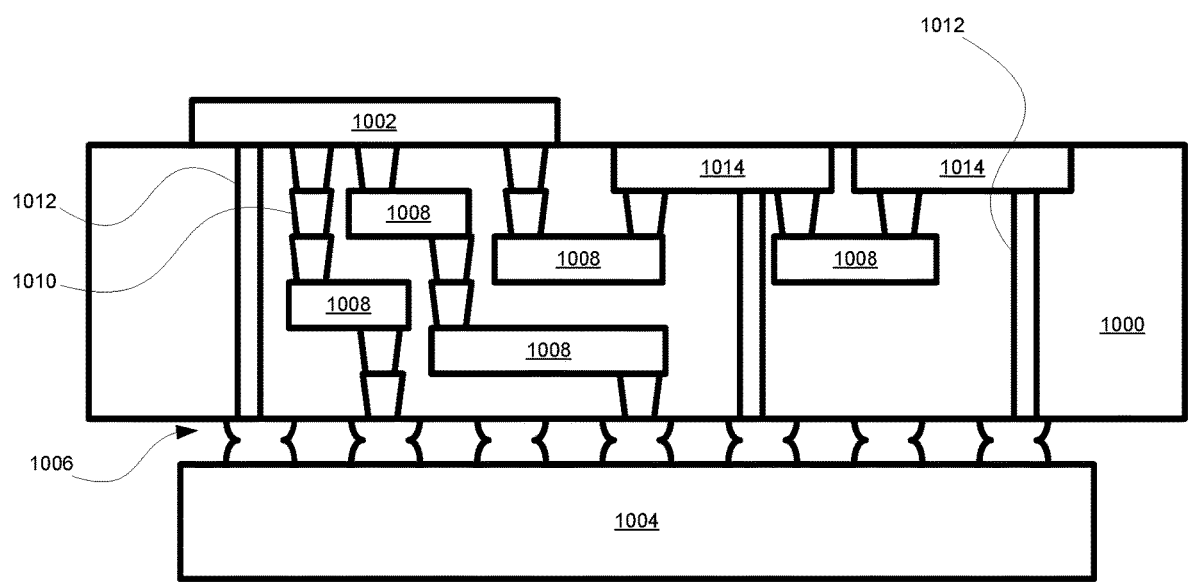
FIG. 5 illustrates an interposer that includes one or more embodiments discussed herein.

FIG. 5 illustrates an interposer 1000 that includes one or more embodiments discussed herein. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of interposer 1000.

Figure 6:
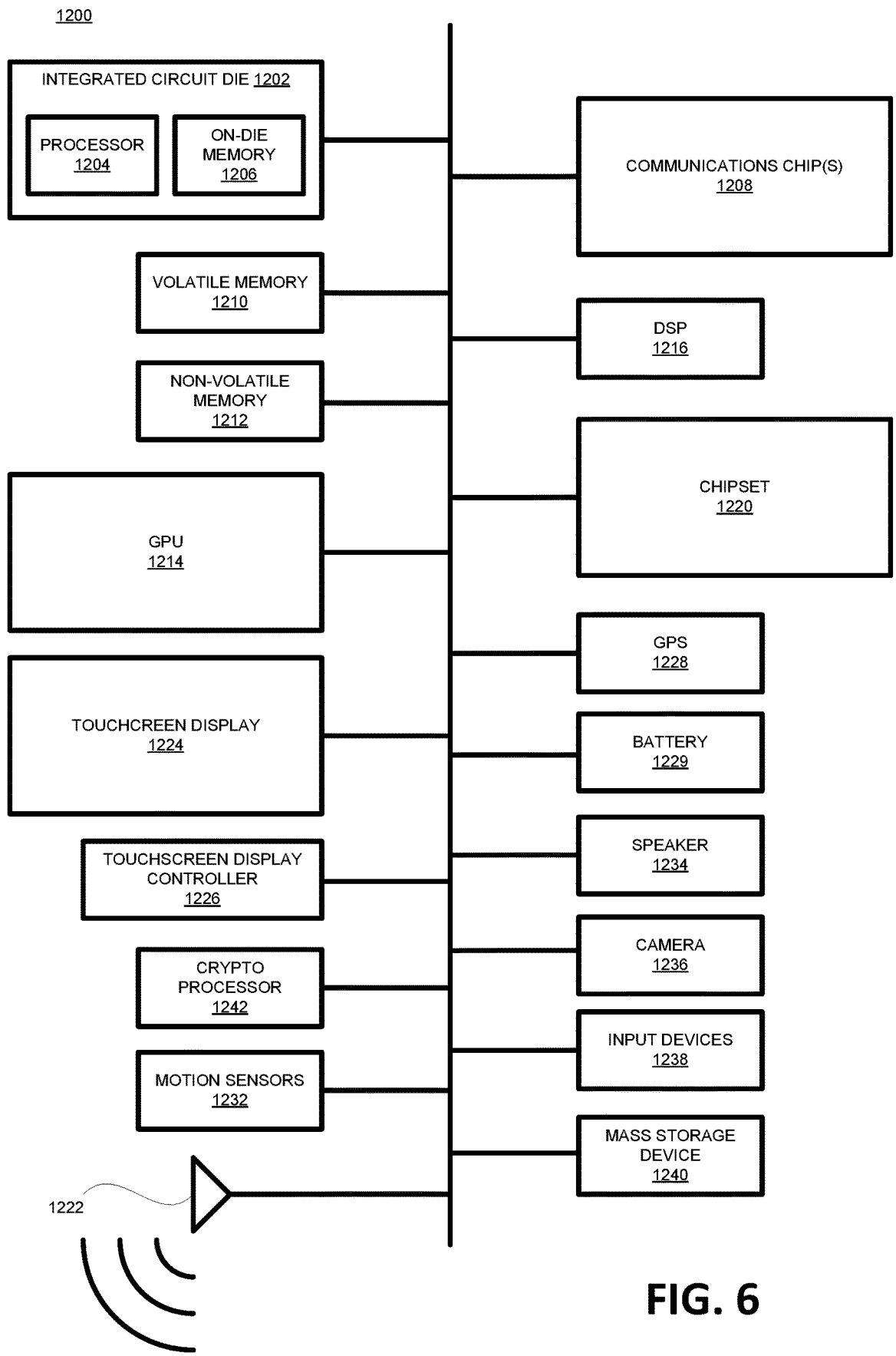
FIG. 6 illustrates a computing device, according to some embodiments.

FIG. 6 illustrates a computing device 1200, according to some embodiments. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications logic unit 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a CPU 1204 as well as on-die memory 1206, often used as cache memory, that can be provided by technologies such as embedded DRAM (eDRAM), SRAM, or spin-transfer torque memory (STT-MRAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory, etc.), a graphics processing unit 1214 (GPU), a digital signal processor 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen controller 1226, a battery 1229 or other power source, a power amplifier (not shown), a voltage regulator (not shown), a global positioning system (GPS) device 1228, a compass (not shown), a motion coprocessor or sensors 1232 (that may include an accelerometer, a gyroscope, and a compass), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, and derivatives thereof, as well as any other wireless protocols that are designated as 3G, 4G, 5G, and beyond. The computing device 1200 may include a plurality of communications logic units 1208. For instance, a first communications logic unit 1208 may be dedicated to shorter range wireless communications such as Wi-Fi, NFC, and Bluetooth and a second communications logic unit 1208 may be dedicated to longer range wireless communications such as GPS, EDGE, GPRS, CDMA, WiMAX, LTE, Ev-DO, and others.

In some embodiments, the processor 1204 of the computing device 1200 includes one or more devices, such as electronic device assemblies 100, 100C, 100D, that are formed in accordance with embodiments disclosed herein. The term "processor" may refer to any device or portion of a device that processes electronic data from registers and/or memory to transform that electronic data into other electronic data that may be stored in registers and/or memory.

The communications logic unit 1208 may also include one or more devices, such as electronic device assemblies 100, 100C, 100D, that are formed in accordance with embodiments disclosed herein.

In further embodiments, another component housed within the computing device 1200 may contain one or more devices, such as electronic device assemblies 100, 100C, 100D, that are formed in accordance with implementations disclosed herein.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

The following is a list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

An electronic device assembly, including: a first region having circuitry formed therein or thereon; a second region having circuitry formed therein or thereon; an interlayer dielectric region between the first region and the second region; a conductive interlayer structure formed through the interlayer dielectric region and connecting the first region to the second region; and a barrier region formed around the conductive interlayer structure and including a composition of General Formula I:

$$M_l\text{-}Al_m\text{-}X^1_n\text{-}X^2_p\text{-}C_q\text{-}O_r;\qquad(I)$$

wherein M includes a metal selected from one or more of titanium, zirconium, hafnium, tantalum, niobium and vanadium; C includes carbon; O includes oxygen; $X^1$ includes gallium; $X^2$ includes indium; and l, m, n, p, q and r represent an atomic percent of an element in the barrier region that can be 0 percent, but n and p cannot both be 0 percent, and l is 0-60 atomic percent, m is 0-35 atomic percent, n is 0-70 atomic percent, p is 0-70 atomic percent, q is 0-50 atomic percent, and r is 0-5 atomic percent.

Example 2

The electronic device assembly of Example 1, wherein m is 0 to 35 atomic percent, n is 0 to 70 atomic percent, p is 0 to 70 atomic percent, q is 0.1 to 60 atomic percent, and r is 0 to 5 atomic percent.

Example 3

The electronic device assembly according to any one of Examples 1 and 2, wherein M is present in an amount of l=10 to 60 atomic percent.

Example 4

The electronic device assembly according to any one of Examples 1-3, wherein n is 0.1 to 70 atomic percent and p is 0 atomic percent.

Example 5

The electronic device assembly according to any one of Examples 1-3, wherein p is 0.1 to 70 atomic percent and n is 0 atomic percent.

Example 6

The electronic device assembly according to any one of Examples 1-5, wherein m is 5 to 35 atomic percent and only one of n and p is 0 atomic percent.

Example 7

The electronic device assembly according to any one of Examples 1-6, wherein the barrier region includes a graded composition including a plurality of compositions of General Formula I.

Example 8

The electronic device assembly according to any one of Examples 1-7, wherein the conductive interlayer structure includes at least one material selected from the group consisting of Cu, Co, Ru, W, and Ni.

Example 9

The electronic device assembly according to any one of Examples 1-7, wherein the conductive interlayer structure includes at least one of alpha tantalum (Ta) or beta Ta.

Example 10

The electronic device assembly according to any one of Examples 1-9, wherein the barrier region is co-deposited with a second metal to form a composite liner material with improved wetting of a current carrying metal.

Example 11

The electronic device assembly of Example 10, wherein the second metal includes Ru.

Example 12

The electronic device assembly according to any one of Examples 1-11, wherein the barrier region is doped with Mn.

Example 13

The electronic device assembly according to any one of Examples 1-12, wherein the barrier region has a thickness of about 0.5 to 3 nanometers.

Example 14

A method of forming an electronic device assembly, the method including: heating a substrate including an interlayer dielectric region formed therein or thereon, the interlayer dielectric region including a passage formed therethrough; exposing a surface of the passage to a first precursor, a metal cation of the first precursor selected from the group consisting of titanium, zirconium, hafnium, tantalum, niobium and vanadium; removing any unreacted portions of the first precursor and reaction by-products; exposing the surface of the passage to a second precursor including one of an alkylgallium precursor or an alkylindium precursor; removing any unreacted portion of the second precursor and reaction by-products; repeating exposing a surface to a first precursor, removing any unreacted portions of the first precursor, exposing the surface of the passage to a second precursor, and removing any unreacted portion of the second precursor until a barrier region having a desired thickness is formed; and forming a conductive interlayer structure within the passage.

Example 15

The method of Example 14, further including: exposing the surface of the passage to a third precursor including the other of the alkylgallium precursor or the alkylindium precursor; and removing any unreacted portion of the third precursor and reaction by-products; wherein repeating further includes repeating exposing the surface of the passage to the third precursor and removing any unreacted portion of the third precursor and reaction by-products.

Example 16

The method according to any one of Examples 14 and 15, further including: exposing the surface of the passage to an alkylaluminum precursor; and removing any unreacted portion of the alkylaluminum precursor and reaction by-products; wherein repeating further includes repeating exposing the surface of the passage to the alkylaluminum precursor and removing any unreacted portion of the alkylaluminum precursor and reaction by-products.

Example 17

The method according to any one of Examples 14-16, wherein exposing a surface of the passage to a first precursor includes exposing the surface of the passage to a precursor including a metal halide $MX_n$, wherein the halide $X_n$ includes one or more of fluorine (F), chlorine (Cl), bromine (Br), or iodine (I), and n=4 or 5.

Example 18

The method according to any one of Examples 14-17, wherein: exposing a surface of the passage to a first precursor also includes exposing a surface of a via to the first precursor; exposing the surface of the passage to the second precursor also includes exposing the surface of the via to the second precursor; and forming a conductive interlayer structure in the passage further includes forming the conductive interlayer structure in the via.

Example 19

A computing device including: a processor mounted on a substrate; a memory unit capable of storing data; and a graphics processing unit; wherein at least one of the processor, the memory unit, and the graphics processing unit includes: an interlayer dielectric region between a first region and a second region; a conductive interlayer structure formed through the interlayer dielectric region; and a barrier region between the conductive interlayer structure and the interlayer dielectric region, the barrier region including a composition of General Formula I:

$$M_l\text{-}Al_m\text{—}X^1_n\text{—}X^2_p\text{—}C_q\text{—}O_r; \qquad (I)$$

wherein M includes a metal selected from one or more of titanium, zirconium, hafnium, tantalum, niobium and vanadium; C includes carbon; O includes oxygen; $X^1$ includes gallium; $X^2$ includes indium; and l, m, n, p, q and r represent an atomic percent of an element in the barrier region that can be 0 percent, but n and p cannot both be 0 percent.

Example 20

The computing device of Example 19, further including an antenna within the computing device, a display on the computing device, a battery within the computing device, a power amplifier within the processor, and a voltage regulator within the processor.

Example 21

The computing device according to any one of Examples 19 and 20, wherein the barrier region has a thickness of about 0.5 to 3 nanometers.

Example 22

The electronic device assembly according to any one of Examples 19-21, wherein the conductive interlayer structure includes at least one material selected from the group consisting of Cu, Co, Ru, W, and Ni.

Example 23

A method of operating an electronic device assembly, the method including: applying at least one of a voltage potential or an electrical current to at least a portion of a first region having circuitry formed therein or thereon; conducting the voltage potential to a second region having circuitry formed therein or thereon with a conductive interlayer structure formed through an interlayer dielectric region between the first region and the second region, the conductive interlayer structure separated from the interlayer dielectric region by a barrier region formed around the conductive interlayer structure and including a composition of General Formula I:

$$M_l\text{-}Al_m\text{—}X^1_n\text{—}X^2_p\text{—}C_q\text{—}O_r; \qquad (I)$$

wherein M includes a metal selected from one or more of titanium, zirconium, hafnium, tantalum, niobium and vanadium; C includes carbon; O includes oxygen; $X^1$ includes gallium; $X^2$ includes indium; and l, m, n, p, q and r represent an atomic percent of an element in the barrier region that can be 0 percent, but n and p cannot both be 0 percent, and l is 0-60 atomic percent, m is 0-35 atomic percent, n is 0-70 atomic percent, p is 0-70 atomic percent, q is 0-50 atomic percent, and r is 0-5 atomic percent.

Example 24

The method of Example 23, wherein m is 0 to 35 atomic percent, n is 0 to 70 atomic percent, p is 0 to 70 atomic percent, q is 0.1 to 60 atomic percent, and r is 0 to 5 atomic percent.

Example 25

The method according to any one of Examples 23 and 24, wherein M is present in an amount of l=10 to 60 atomic percent.

Example 26

The method according to any one of Examples 23-25, wherein n is 0.1 to 70 atomic percent and p is 0 atomic percent.

Example 27

The method according to any one of Examples 23-25, wherein p is 0.1 to 70 atomic percent and n is 0 atomic percent.

Example 28

The method according to any one of Examples 23-27, wherein m is 5 to 35 atomic percent and only one of n and p is 0 atomic percent.

Example 29

The method according to any one of Examples 23-28, wherein the barrier region includes a graded composition including a plurality of compositions of General Formula I.

Example 30

The method according to any one of Examples 23-29, wherein the conductive interlayer structure includes at least one material selected from the group consisting of Cu, Co, Ru, W, and Ni.

Example 31

The method according to any one of Examples 23-29, wherein the conductive interlayer structure includes at least one of alpha tantalum (Ta) or beta Ta.

Example 32

The method according to any one of Examples 23-32, wherein the barrier region is co-deposited with a second metal to form a composite liner material with improved wetting of a current carrying metal.

Example 33

The method of Example 32, wherein the second metal includes Ru.

Example 34

The method according to any one of Examples 23-33, wherein the barrier region is doped with Mn.

Example 35

The method according to any one of Examples 23-34, wherein the barrier region has a thickness of about 0.5 to 3 nanometers.

Example 36

An electronic device assembly, including: a substrate including: an interlayer dielectric region formed therein or thereon; a conductive interlayer structure; and a barrier region around the conductive interlayer structure, the conductive interlayer structure and the barrier region formed through the interlayer dielectric region; wherein the conductive interlayer structure and the barrier region are formed by: exposing a surface of a passage through the interlayer dielectric region to a first precursor, a metal cation of the first precursor selected from the group consisting of titanium, zirconium, hafnium, tantalum, niobium and vanadium; exposing the surface of the passage to a second precursor including one of an alkylgallium precursor or an alkylindium precursor; repeating exposing a surface to a first precursor, removing any unreacted portions of the first precursor, exposing the surface of the passage to a second precursor, and removing any unreacted portion of the second precursor until a barrier region having a desired thickness is formed; and forming the conductive interlayer structure within the passage.

Example 37

The electronic device assembly of Example 36, wherein the conductive interlayer structure is further formed by exposing the surface of the passage to a third precursor including the other of the alkylgallium precursor or the alkylindium precursor, wherein repeating further includes repeating exposing the surface of the passage to the third precursor.

Example 38

The electronic device assembly according to any one of Examples 36 and 37, wherein the conductive interlayer structure is further formed by exposing the surface of the passage to an alkylaluminum precursor, wherein repeating further includes repeating exposing the surface of the passage to the alkylaluminum precursor and removing any unreacted portion of the alkylaluminum precursor and reaction by-products.

Example 39

The electronic device assembly according to any one of Examples 36-38, wherein the first precursor includes a metal halide MXn, wherein the halide Xn includes one or more of fluorine (F), chlorine (Cl), bromine (Br), or iodine (I), and n=4 or 5.

Example 40

The method according to any one of Examples 36-39, wherein: exposing a surface of the passage to a first precursor also includes exposing a surface of a via to the first precursor; exposing the surface of the passage to the second precursor also includes exposing the surface of the via to the second precursor; and forming a conductive interlayer structure in the passage further includes forming the conductive interlayer structure in the via.

Example 41

A method of operating a computing device, the method including: operating a processor mounted on a substrate; operating a memory unit capable of storing data; and operating a graphics processing unit; wherein at least one of the processor, the memory unit, and the graphics processing unit includes: an interlayer dielectric region between a first region and a second region; a conductive interlayer structure formed through the interlayer dielectric region; and a barrier region between the conductive interlayer structure and the interlayer dielectric region, the barrier region including a composition of General Formula I:

$$M_l Al_m - X^1_n - X^2_p - C_q - O_r; \tag{I}$$

wherein M includes a metal selected from one or more of titanium, zirconium, hafnium, tantalum, niobium and vanadium; C includes carbon; O includes oxygen; $X^1$ includes gallium; $X^2$ includes indium; and l, m, n, p, q and r represent an atomic percent of an element in the barrier region that can be 0 percent, but n and p cannot both be 0 percent.

Example 42

The method of Example 41, further including operating an antenna within the computing device, operating a display on the computing device, operating a battery within the computing device, operating a power amplifier within the processor, and operating a voltage regulator within the processor.

Example 43

The method according to any one of Examples 41 and 42, wherein the barrier region has a thickness of about 0.5 to 3 nanometers.

Example 44

The method according to any one of Examples 41-43, wherein the conductive interlayer structure includes at least one material selected from the group consisting of Cu, Co, Ru, W, and Ni.

Example 45

A non-transitory computer-readable storage medium including computer-readable instructions stored thereon, the computer-readable instructions configured to instruct a processor to perform at least a portion of the method according to any one of Examples 14-18, 23-35, and 41-44.

Example 46

A means for performing at least a portion of the method according to any one of Examples 14-18, 23-35, and 41-44.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:
1. An electronic device assembly, comprising:
a first region having circuitry formed therein or thereon;
a second region having circuitry formed therein or thereon;
an interlayer dielectric region between the first region and the second region;
a conductive interlayer structure formed through the interlayer dielectric region and connecting the first region to the second region; and a barrier region formed around the conductive interlayer structure and including a composition of General Formula I:

$$M_l\text{-}Al_m\text{—}X^1_n\text{—}X^2_p\text{—}C_q\text{—}O_r;$$ (I)

wherein M comprises a metal selected from one or more of titanium, zirconium, hafnium, tantalum, niobium and vanadium; C comprises carbon; O comprises oxygen; $X^1$ comprises gallium; $X^2$ comprises indium; and l, m, n, p, q and r represent an atomic percent of an element in the barrier region that can be 0 percent, but n cannot be 0 percent, and wherein the barrier region comprises a graded composition comprising a plurality of differing compositions of the General Formula I, wherein the barrier region is graded with the plurality of differing compositions of the General Formula 1 throughout an entirety of the barrier region.

2. The electronic device assembly of claim 1, wherein m is 0 to 35 atomic percent, n is up to 70 atomic percent, p is 0 to 70 atomic percent, q is 0.1 to 60 atomic percent, and r is 0 to 5 atomic percent.

3. The electronic device assembly of claim 1, wherein M is present in an amount of l=10 to 60 atomic percent.

4. The electronic device assembly of claim 1, wherein n is 0.1 to 70 atomic percent and p is 0 atomic percent.

5. The electronic device assembly of claim 1, wherein p is 0.1 to 70 atomic percent.

6. The electronic device assembly of claim 1, wherein m is 5 to 35 atomic percent and only one of n and p is 0 atomic percent.

7. The electronic device assembly of claim 1, wherein the conductive interlayer structure comprises at least one material selected from the group consisting of Cu, Co, Ru, W, and Ni.

8. The electronic device assembly of claim 1, wherein the conductive interlayer structure comprises at least one of alpha tantalum (Ta) or beta Ta.

9. The electronic device assembly of claim 1, wherein the barrier region is co-deposited with a second metal to form a composite liner material with improved wetting of a current carrying metal.

10. The electronic device assembly of claim 9, wherein the second metal comprises Ru.

11. The electronic device assembly of claim 1, wherein the barrier region is doped with Mn.

12. The electronic device assembly of claim 1, wherein the barrier region has a thickness of about 0.5 to 3 nanometers.

13. The electronic device assembly of claim 1, wherein l is 0-60 atomic percent, m is 0-35 atomic percent, n is up to 70 atomic percent, p is 0-70 atomic percent, q is 0-50 atomic percent, and r is 0-5 atomic percent.

14. A method of forming an electronic device assembly, the method comprising:
heating a substrate including an interlayer dielectric region formed therein or thereon, the interlayer dielectric region including a passage formed therethrough;
exposing a surface of the passage to a first precursor, a metal cation of the first precursor selected from the group consisting of titanium, zirconium, hafnium, tantalum, niobium and vanadium;
removing any unreacted portions of the first precursor and reaction by-products;
exposing the surface of the passage to a second precursor comprising one of an alkylgallium precursor or an alkylindium precursor;
removing any unreacted portion of the second precursor and reaction by-products;
repeating exposing the surface to the first precursor, removing any unreacted portions of the first precursor, exposing the surface of the passage to the second precursor, and removing any unreacted portion of the second precursor until a barrier region having a desired thickness is formed; and
forming a conductive interlayer structure within the passage.

15. The method of claim 14, further comprising:
exposing the surface of the passage to a third precursor comprising the other of the alkylgallium precursor or the alkylindium precursor; and
removing any unreacted portion of the third precursor and reaction by-products;
wherein repeating further comprises repeating exposing the surface of the passage to the third precursor and removing any unreacted portion of the third precursor and reaction by-products.

16. The method claim 14, further comprising:
exposing the surface of the passage to an alkylaluminum precursor; and
removing any unreacted portion of the alkylaluminum precursor and reaction by-products;
wherein repeating further comprises repeating exposing the surface of the passage to the alkylaluminum precursor and removing any unreacted portion of the alkylaluminum precursor and reaction by-products.

17. The method claim 14, wherein exposing the surface of the passage to the first precursor comprises exposing the surface of the passage to a precursor including a metal halide MXn, wherein the halide Xn includes one or more of fluorine (F), chlorine (Cl), bromine (Br), or iodine (I), and n=4 or 5.

18. The method of claim 14, wherein:
exposing the surface of the passage to the first precursor also includes exposing a surface of a via to the first precursor;
exposing the surface of the passage to the second precursor also includes exposing the surface of the via to the second precursor; and
forming the conductive interlayer structure in the passage further comprises forming the conductive interlayer structure in the via.

19. A computing device comprising:
a processor mounted on a substrate;
a memory unit capable of storing data; and
a graphics processing unit;
wherein at least one of the processor, the memory unit, and the graphics processing unit comprises:
an interlayer dielectric region between a first region and a second region;
a conductive interlayer structure formed through the interlayer dielectric region; and
a barrier region between the conductive interlayer structure and the interlayer dielectric region, the barrier region including a composition of General Formula I:

$$M_l\text{-}Al_m\text{—}X^1_n\text{—}X^2_p\text{—}C_q\text{—}O_r;$$ (I)

wherein M comprises a metal selected from one or more of titanium, zirconium, hafnium, tantalum, niobium and vanadium; C comprises carbon; O comprises oxygen; $X^1$ comprises gallium; $X^2$ comprises indium; and l, m, n, p, q and r represent an atomic percent of an element in the barrier region that can be 0 percent, but n cannot be 0 percent, and wherein the barrier region comprises a graded composition comprising a plurality of differing compositions of the General Formula I, wherein the barrier region is graded with the plurality of differing compositions of the General Formula 1 throughout an entirety of the barrier region.

20. The computing device of claim 19, further comprising an antenna within the computing device, a display on the computing device, a battery within the computing device, a power amplifier within the processor, and a voltage regulator within the processor.

21. The computing device of claim 19, wherein the barrier region has a thickness of about 0.5 to 3 nanometers.

22. The computing device assembly of claim 19, wherein the conductive interlayer structure comprises at least one material selected from the group consisting of Cu, Co, Ru, W, and Ni.

23. The computing device assembly of claim 19, wherein l is 0-60 atomic percent, m is 0-35 atomic percent, n is up to 70 atomic percent, p is 0-70 atomic percent, q is 0-50 atomic percent, and r is 0-5 atomic percent.

24. An electronic device assembly, comprising:
a first region having circuitry formed therein or thereon;
a second region having circuitry formed therein or thereon;
an interlayer dielectric region between the first region and the second region;
a conductive interlayer structure formed through the interlayer dielectric region and connecting the first region to the second region; and
a barrier region formed around the conductive interlayer structure and including a composition of General Formula I:

$$M_l\text{-}Al_m\text{—}X^1_n\text{—}X^2_p\text{—}C_q\text{—}O_r; \quad (I)$$

wherein M comprises a metal selected from one or more of titanium, zirconium, hafnium, tantalum, niobium and vanadium; C comprises carbon; O comprises oxygen; $X^1$ comprises gallium; $X^2$ comprises indium; and l, m, n, p, q and r represent an atomic percent of an element in the barrier region that can be 0 percent, but n and p cannot both be 0 percent, wherein l is 0-60 atomic percent, m is 0-35 atomic percent, n is 0-70 atomic percent, p is 0-70 atomic percent, q is 0-50 atomic percent, and r is 0-5 atomic percent, and wherein the barrier region comprises a graded composition comprising a plurality of differing compositions of the General Formula I, wherein the barrier region is graded with the plurality of differing compositions of the General Formula 1 throughout an entirety of the barrier region.

* * * * *